(12) United States Patent
Tsai et al.

(10) Patent No.: US 6,787,455 B2
(45) Date of Patent: Sep. 7, 2004

(54) BI-LAYER PHOTORESIST METHOD FOR FORMING HIGH RESOLUTION SEMICONDUCTOR FEATURES

(75) Inventors: Ming-Huan Tsai, Jubei (TW); Hun-Jan Tao, Hsinchu (TW); Ju-Wang Hsu, Taipei (TW); Cheng-Ku Chen, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 226 days.

(21) Appl. No.: 10/032,353

(22) Filed: Dec. 21, 2001

(65) Prior Publication Data

US 2003/0119330 A1 Jun. 26, 2003

(51) Int. Cl.[7] .......................................... H01L 21/4763
(52) U.S. Cl. ........................ 438/638; 438/708; 430/314
(58) Field of Search .................................. 438/638, 708, 438/624, 634; 430/270.1, 314

(56) References Cited

U.S. PATENT DOCUMENTS 5,925,494 A * 7/1999 Horn ........................ 430/270.1
6,514,672 B2 * 2/2003 Young et al. ................ 430/314

* cited by examiner

Primary Examiner—Long Pham
Assistant Examiner—Hoa B. Trinh
(74) Attorney, Agent, or Firm—Tung & Associates

(57) ABSTRACT

A method for semiconductor device feature development using a bi-layer photoresist including providing a non-silicon containing photoresist layer over a substrate; providing a silicon containing photoresist over the non-silicon containing photoresist layer; exposing said silicon containing photoresist layer to an activating light source an exposure surface defined by an overlying pattern according to a photolithographic process; developing said silicon containing photoresist layer according to a photolithographic process to reveal a portion the non-silicon containing photoresist layer; and, dry developing said non-silicon containing photoresist layer in a plasma reactor by igniting a plasma from an ambient mixture including at least oxygen, carbon monoxide, and argon.

20 Claims, 1 Drawing Sheet

BI-LAYER PHOTORESIST METHOD FOR FORMING HIGH RESOLUTION SEMICONDUCTOR FEATURES

FIELD OF THE INVENTION

This invention generally relates to photoresist methods for forming semiconductor features and more particularly to a bi-layer photoresist dry development method for high resolution features.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

As devices continue to shrink in size, the limits of processing technologies are reached requiring new and cost effective innovations. For example, acceptable photoresist imaging is one limiting technology that has required the adoption of new approaches as finer imaging resolutions are sought to meet the requirements of smaller device sizes. For example, single layer photoresist layers have the problem that they need both effective etching resistance and depth of focus (DOF) requirement. However, the former requirement calls for thicker photoresist layers while the latter requirement calls for thinner photoresist layers. One approach has been to move to bi-layer and tri-layer photoresist layers where the uppermost photoresist layer is used for imaging thereby allowing a thinner image layer and acceptable depth of focus (DOF) with a larger photo-window. Consequently, resolution, and pattern width control are enhanced.

A corresponding requirement to achieve high resolution features and critical dimension control is an effective development process. Wet processing techniques have increasingly become inadequate due to several problems including photoresist poisoning of features by leaving undeveloped photoresist caused by either or both, step height limitations affecting the photo imaging process or by residual nitrogen contaminating species interfering with photoresist exposure and development processes.

As such, dry development processes involving plasma etching have been increasingly adopted leading to improved etching profiles. However, dry etching (plasma etching) has demonstrated problems of its own including, for example, critical dimension bias between isolated and dense line areas where, due to microloading, isolated lines etch faster than dense lines leading to unacceptable differences in critical dimension. For example, in single layer photoresists, dry development of, for example, via holes, leads to roughened hole edges or "striation". If a hard mask, such as a metal nitride, is used over the inter-layer dielectric (ILD) insulating layer, the via hole edges are tapered to wider dimension referred to as "top CD blow out". Bi-layer approaches have led to some improvement in dry etching critical dimension control, however, further improvement is need in etching selectivity in dry development as resolution demands are increased, for example with 193 nm and 157 nm photoresists.

For example, more recent shorter wavelength photoresist approaches have used a surface modification technique where the surface of a photoresist film is silylated after the exposure to light. Following exposure, a dry development process is used to form a pattern having good resolution and resistance to dry etching. According to this technique, an initial pattern is formed in a region of about 1000 Angstroms of thickness within of the photoresist film. The silylated surface layer is intended to protect the lower layer from premature etching thus resulting in better selectivity and smoother etching profiles following dry etching of a feature. However, at the dry development stage, the plasma etching procedure according to the prior art has the shortcoming that the sidewalls of the underlying photoresist layer may be over-etched, causing a tapered cross section and loss of critical dimension. The sidewall etching of the underlying photoresist layer in a bi-layer approach using silylation of the surface layer is believed to occur since the silylation is limited to about the first 200 to 300 Angstroms adjacent the surface of the upper photoresist layer. As a result, the stability of the pattern deteriorates as the dry etching development process proceeds through the photoresist layers.

In the prior art, the dry development etching process has used a sulfur dioxide ($SO_2$) based chemistry including oxygen ($O_2$). Sulfur dioxide ($SO_2$) based chemistry in dry development forms a passivating layer on the sidewalls of the photoresist layers thereby in theory increasing the anisotropicity of the etching process to reduce the microloading effects. However, as mentioned, the sulfur dioxide dry development chemistry has limitations, including continued problems with loss of critical dimension during dry development.

Another problem with sulfur dioxide based chemistry including oxygen is the requirement that photoresist dry development and feature etching that each process occur in a separate plasma reactor due the large number of residual particles generated during the feature etching process thus presenting a high possibility of contamination in the photoresist development process. As a result, the dry development procedure according to the prior art is equipment and time intensive, leading to higher manufacturing expense.

There is therefore a need in the semiconductor processing art to develop a more reliable bi-layer photoresist dry development process with high resolution that may be carried out with greater efficiency.

It is therefore an object of the invention to provide to develop a more reliable bi-layer photoresist dry development process with high resolution that may be carried out with greater efficiency while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for semiconductor device feature development using a bi-layer photoresist.

In a first embodiment according to the present invention includes the steps of providing a non-silicon containing photoresist layer over a substrate; providing a silicon containing photoresist over the non-silicon containing photoresist layer; exposing said silicon containing photoresist layer to an activating light source an exposure surface defined by an overlying pattern according to a photolithographic process; developing said silicon containing photoresist layer according to a photolithographic process to reveal a portion the non-silicon containing photoresist layer; and, dry developing said non-silicon containing photoresist layer in a plasma reactor by igniting a plasma from an ambient mixture including at least oxygen, carbon monoxide, and argon.

In a related embodiment the plasma reactor includes at least one RF power source for plasma excitation and at least one RF power source for accelerating plasma generated ions towards the substrate surface.

In other related embodiments, the non-silicon containing photoresist layer comprises a non-photoactive polymer. Further, the ambient mixture includes about 1 part oxygen, about 10 to about 50 parts carbon monoxide, and about 10 to about 50 parts Argon. Further yet, the activating light source has a wavelength of one of about 157 nanometers and about 193 nanometers.

In another related embodiment, the non-silicon containing photoresist layer has a thickness greater than the silicon containing photoresist layer.

In another embodiment, the method further includes removing the silicon containing photoresist layer according to a first in-situ ashing process. Further, the first in-situ ashing process includes igniting a plasma to include nitrogen, fluorine, and oxygen ions.

In another embodiment, the method further includes etching a semiconductor feature according to a reactive ion etch process. Further, the semiconductor feature includes the semiconductor feature includes one of a via hole, a trench line, a contact hole, a shallow trench isolation feature, and a polysilicon gate feature. Further yet, the reactive ion etch process includes hydrofluorocarbon containing ambient having a fluorine to carbon ratio of at most about 2.

In another embodiment, the method further includes removing the non-silicon containing photoresist layer according to a second in-situ ashing process. Further, the second in-situ ashing process includes igniting a plasma to include nitrogen, fluorine, and oxygen ions, said plasma optimized to simultaneously clean plasma contact surfaces.

In yet another embodiment, the method further includes reactively ion etching through a thickness of a metal nitride layer using a hydrofluorocarbon containing plasma to at least partially form the semiconductor feature including one of a via hole and contact hole.

In yet a further embodiment, the method includes performing an in-situ cleaning process including igniting a plasma to include nitrogen, fluorine, and oxygen ions, said plasma optimized to clean plasma contact surfaces.

In a related embodiment, the step including the first in-situ ashing process is combined with the step including the second in-situ ashing process to reduce a sequential number of steps.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained by reference to a via patterning and etching process it will be appreciated that the present invention may be applied to the photolithographic patterning and etching of any semiconductor feature where critical dimension control and high resolution may be advantageous. For example, the present invention may be applied to the patterning and etching of trench lines, polysilicon gate structures, and shallow trench isolation structures (STI) to mention a few exemplary applications.

Figure 1A:
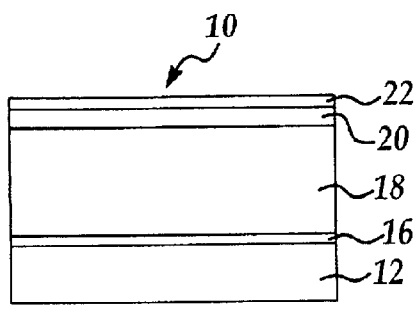
FIGS. 1A to 1G are cross sectional side view representations of a portion a semiconductor device according to a step wise manufacturing process of the present invention.

For example, referring to FIG. 1A, is shown a portion of a dual damascene structure 10 at a stage in the manufacturing process. The structure 10 includes, for example, a substrate of monocrystalline silicon 12, for example a semiconductor wafer. Other substrates may be used according to the present invention, for example in a multilayer device, the substrate may be an insulating layer including a conductive region (not shown) Overlying the substrate 12, is formed an etching stop layer 16, typically a metal nitride such as silicon nitride (e.g., $Si_3N_4$) or silicon oxynitride (e.g., SiON). The metal nitride etching stop layer 16 is typically deposited by a (chemical vapor deposition (CVD) process including for example, PECVD (plasma enhanced CVD), LPCVD (low pressure CVD), or HDPCVD (high density plasma CVD) by reacting silane ($SiH_4$) or an amine-containing metal-organic precursor with ammonia ($NH_3$) or nitrogen, and including oxygen in the case the metal nitride is oxygen containing such as silicon oxynitride, under conditions that are well known in the art. The preferred thickness of the etching stop layer 16 is between about 300 and 1000 Angstroms.

Overlying the etching stop layer 16 is an inter-layer dielectric (ILD) layer 18 formed of, for example, low-k carbon doped silicon dioxide. Again, this layer may be formed by a PECVD process although other process well known in the art may be used. The insulating layer 18 is deposited to a preferred thickness of between about 3000 and 10000 Angstroms. As device sizes shrink, typically a low-k (low dielectric constant material) with a dielectric constant of less than about 3 is used in order to reduce signal delay times due to parasitic capacitance effects. It will be appreciated, however, that conventional silicon dioxide may also be used as the insulating layer 18. Other exemplary materials that may be used in the ILD layer, include low-k organic materials applied by a spin coating process.

In the method according to the present invention, a first photoresist layer 20 of a non-silicon containing organic material, for example a resinous I-line photoresist or acrylic polymer is deposited over the ILD layer 18 by a typical spin coating method. The photoresist layer 20 need not be photoactive, for example, need not contain a photo-generated acid. One exemplary organic resin for photoresist layer 20 may further include a polyvinyl alcohol resin. Photoresist layer 20 is preferably deposited to a thickness of between about 1000 Angstroms and 5000 Angstroms. The photoresist layer 20 is preferably baked at a temperature of between about 120° C. and 130° C. for a duration of between about 2 and 3 minutes.

A second photoresist layer 22 with a thickness of about 500 Angstroms to about 3000 Angstroms, but preferably thinner than first photoresist layer 20, is then formed over the first photoresist layer 20 by a similar method. The second photoresist layer 22 is preferably a silicon containing organic including silicon monomers and is a DUV resist photoactive at, for example, 193 nm and 157 nm. Exemplary photoresists include, for example, a terpolymer photoresist of methacrylic acid. Photoresist layer 22 is preferably applied by spin coating and baked at a temperature of between about 120° C. and 130° C. for a duration of between about 2 and 3 minutes.

Less preferably, a non-silicon containing photoresist may be used for second photoresist layer 22 and subjected to a silylation process. During silylation, the photoresist is heated in an atmosphere containing a silylation agent. For example, typical silylation agents include N,N Diethylamino-trimethylsilane (TMSDEA), 1, 1, 3, 3-Tetramethyldisilazane (TMDS), Trimethylsilyldimethylamine (TMSDMA), Dimethylsilyl-diethylamine (DMSDEA), and Dimethylsilyldimethylamine (DMSDMA).

Both the silylation process and the silicon-containing photoresist will make the exposed portion of the photoresist layer 22 resistant to dry etchants during the dry development process by plasma reactive ion etching (RIE). However, a silicon containing photoresist is preferred for photoresist layer 22 since the silylation process may be undesirably limited to the surface portion of the second photoresist layer 22.

Figure 1B:
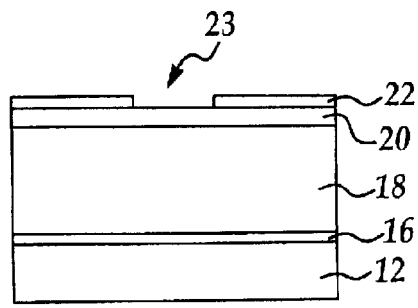

Following deposition of photoresist layers 20 and 22, photoresist layer 22 is exposed to an activating light source through an overlying photomask (pattern) including, for example, wavelengths of 193 nm and 157 nm. Referring now to FIG. 1B, the exposed portions of the photoresist layer, e.g., 23 are developed away using a conventional developer leaving the unexposed portions of the photoresist layer 22 as a dry development photomask.

Following the conventional developing process of photoresist layer 22, a dry development process is used to develop the exposed portions of the underlying photoresist layer 20 thereby forming a semiconductor feature etching pattern. According to the present invention, the dry development process is preferably performed in a dual RF power source plasma reactor, for example, a high density plasma reactor such as an inductively coupled plasma (ICP) reactor or transformer coupled plasma (TCP) reactor.

Figure 2:
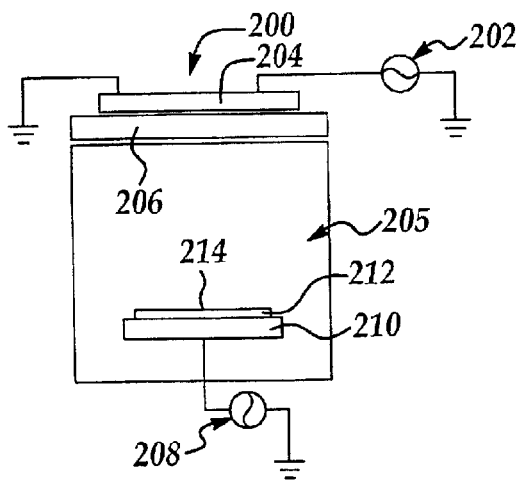
FIG. 2 is a schematic representation of portions of a plasma reactor used according to the present invention.

Turning to FIG. 2, portions of an exemplary dual RF plasma reactor 200 is shown including a first RF power source 202 for plasma excitation in plasma chamber 205 by induction coil 204 through dielectric window 206. A second RF power source 208 attached to wafer chuck 210 holding semiconductor wafer 212 operates as a bias for accelerating ions to bombard the substrate surface 214.

Figure 1C:
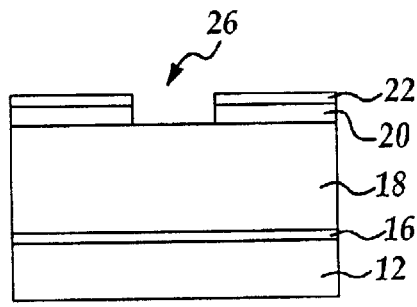

Returning to FIG. 1C, according to the present invention a dry development chemistry including carbon monoxide (CO), oxygen ($O_2$), and argon is used as the etching chemistry to dry develop the second photoresist layer 20 to form, for example, an opening 26 forming an etching mask for a via opening. Preferably, the relative concentrations of the ambient gases supplied to produce a plasma in plasma reactor 200 include about 1 part oxygen, about 10 to about 50 parts carbon monoxide, and about 10 to about 50 parts Argon. Suitable plasma reactor conditions include, for example, a pressure of from about 5 and about 20 mTorr, and an RF power of about 400 to about 500 Watts for the first RF power source and about 100 to about 200 Watts for the second RF power source.

Figure 1D:
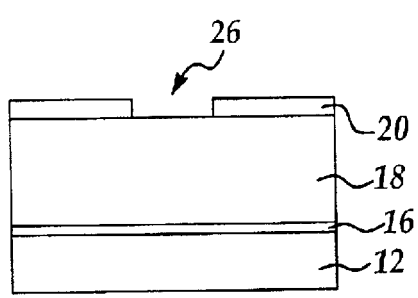
Figure 1E:
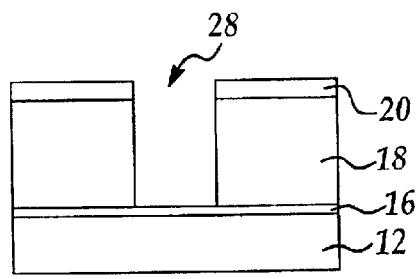

Following the dry development process of photoresist layer 20 to form an etching mask, the first photoresist layer 22 may be optionally removed as shown in FIG. 1D by a first in-situ ashing process using an oxygen-containing plasma. Additionally, the plasma may contain nitrogen and fluorine to aid in cleaning the plasma reactor chamber of residual particle contamination. For example, exemplary suitable conditions for the first in-situ ashing step of the present invention include flowing into the plasma reactor chamber a fluorocarbon, for example, $CF_4$ at 20 to 50 sccm and flowing $O_2$ at 10 to 20 sccm at a pressure of 5 to 20 mTorr while maintaining a first RF power source at about 200 to about 300 Watts and a second RF power source at about 100 to 150 Watts. The plasma reactor chamber ambient may optionally include a source of nitrogen, for example, flowing at about 10 to about 30 sccm. Following the in-situ ashing process to remove first photoresist layer 22, a fluorine based chemistry is used in a reactive ion etch (RIE) to etch a via hole 28 through the thickness of the ILD layer 18 to the etching stop layer 16 as shown in FIG. 1E. For example, suitable plasma etching gas sources include conventional fluorocarbons such as $CF_4$, but preferably include hydrofluorocarbons with a fluorine to carbon ratio of at most about 2, for example, fluorine-containing gases such as $C_2F_6$, $CH_2F_2$, and $C_4F_8$ or mixtures thereof to improve etching anisotropicity.

Figure 1F:
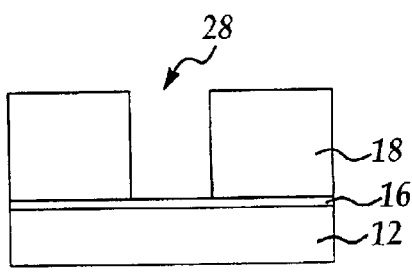

Following via hole RIE etching, the photoresist layer 20 is removed according to a second in-situ ashing process using an oxygen containing plasma as shown in FIG. 1F. During the first or second ashing process, nitrogen or fluorine-containing gases may be added to the plasma to optimize the ashing process for simultaneous cleaning the plasma reactor chamber surfaces (plasma contact surfaces) of residual particles. Exemplary suitable ashing conditions are the same as those detailed for the ashing process for photoresist layer 20. Although the method according to the present invention may optionally include two in-situ ashing processes, the in-situ ashing processes may be combined into a single in-situ ashing process to remove both photoresist layers 22 and 20 following the RIE etching of a semiconductor feature, for example etching through ILD layer 18.

Figure 1G:
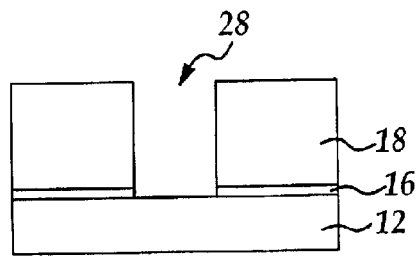

Following the second in-situ ashing process, another RIE etching process is carried out to etch through a thickness of the metal nitride etching stop layer 16 to expose the underlying via contact, for example, silicon substrate 12 as shown in FIG. 1G. In the RIE process to remove the etching stop layer, a conventional etching process may be used, for example, including a mixture of hydrofluorocarbons, for example, a plasma gas source including a mixture of $C_2F_6$, $CH_2F_2$, and $C_4F_8$.

Following RIE etching of the etching stop layer 16, the plasma reactor chamber is subjected to an in-situ plasma cleaning process to clean the plasma reactor chamber surfaces (plasma contact surfaces) to the initial starting condition. The in-situ plasma cleaning process, preferably includes plasma reactor etching conditions as previously outline for the first and second ashing process including a nitrogen or fluorine containing plasma.

Thus, according to the present invention, a method has been presented that allows for a more reliable bi-layer photoresist dry development chemistry with improved resolution that avoids the shortcomings of striations or roughened feature edges according to the prior art. In addition, according to the present invention, the dry development process, including the etching process is carried out with greater efficiency by allowing the semiconductor feature development process in the same plasma reactor chamber, for example, in a contact hole or via etching, from dry development of the photoresist to etch-through of the etch stop layer. According to the present invention, the feature development process including the dry development process is optimized by a dual RF plasma reactor that is additionally optimized for feature etching and in-situ cleaning by using appropriate plasma etching chemistries and reactor conditions thereby increasing the efficiency of the semiconductor manufacturing process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for semiconductor device feature development using a bi-layer photoresist comprising the steps of:
   providing a non-silicon containing photoresist layer over a substrate;
   providing a silicon containing photoresist over the non-silicon containing photoresist layer;
   photolithographically patterning the silicon containing photoresist to reveal a portion of the non-silicon containing photoresist layer; and,
   dry developing said portion of the non-silicon containing photoresist layer in a plasma reactor comprising oxygen ($O_2$) and carbon monoxide (CO) plasma source gases.

2. The method of claim 1, wherein the step of dry developing comprises a plasma reactor comprising at least one RF power source for plasma excitation and at least one RF power source for accelerating plasma generated ions towards the substrate surface.

3. The method of claim 1, wherein the non-silicon containing photoresist layer comprises a non-photoactive polymer.

4. The method of claim 1, wherein the step of dry developing comprises plasma source gases consisting essentially of about 1 part oxygen, about 10 to about 50 parts carbon monoxide, and about 10 to about 50 parts Argon.

5. The method of claim 1, wherein the step of photolithographically patterning comprises a wavelength selected from the group consisting of about 157 nanometers and about 193 nanometers.

6. The method of claim 1, wherein the non-silicon containing photoresist layer has a thickness greater than the silicon containing photoresist layer.

7. The method of claim 6, wherein the non-silicon containing photoresist layer has a thickness of about 1000 Angstroms to about 5000 Angstroms and the silicon containing photoresist layer has a thickness of about 500 Angstroms to about 3000 Angstroms.

8. The method of claim 1, further comprising the step of removing the silicon containing photoresist layer according to a first in-situ ashing process.

9. The method of claim 8, wherein the first in-situ ashing process comprises plasma source gases selected from the group consisting of nitrogen containing, fluorine containing, and oxygen containing to simultaneously clean the plasma reactor contact surfaces.

10. The method of claim 8, further comprising the step of etching a semiconductor feature according to a reactive ion etch process.

11. The method of claim 10, wherein the semiconductor feature includes one of a via hole, a trench line, a contact hole, a shallow trench isolation feature, and a polysilicon gate feature.

12. The method of claim 10, wherein the reactive ion etch process comprises hydrofluorocarbon plasma gas sources having a fluorine to carbon ratio of at most about 2.

13. The method of claim 10, further comprising the step of removing the non-silicon containing photoresist layer according to a second in-situ ashing process.

14. The method of claim 13, wherein the second in-situ ashing process comprises plasma source gases selected from the group consisting of nitrogen containing, fluorine containing, and oxygen containing to simultaneously clean the plasma reactor contact surfaces.

15. The method of claim 14, further comprising the step of reactively ion etching through a thickness of a metal nitride layer using a hydrofluorocarbon containing plasma to at least partially form the semiconductor feature including one of a via hole and contact hole.

16. The method of claim 15, further comprising the step of performing an in-situ cleaning process comprising plasma source gases selected from the group consisting of nitrogen containing, fluorine containing, and oxygen containing to clean plasma contact surfaces.

17. The method of claim 14, wherein the step comprising the first in-situ ashing process is combined with the step comprising the second in-situ ashing process.

18. The method of claim 1, wherein the silicon containing photoresist comprises silicon monomers.

19. The method of claim 1, wherein the silicon containing photoresist is formed by a silylation process.

20. A method for preventing photoresist mask striation using a bi-layer photoresist in a plasma etching process comprising the steps of:
   providing a non-silicon containing photoresist layer over a substrate;
   providing a silicon containing photoresist over the non-silicon containing photoresist layer;
   photolithographically patterning said silicon containing photoresist layer form a dry development photomask for dry developing the non-silicon containing photoresist layer; and
   dry developing the non-silicon containing photoresist layer using plasma source gases comprising oxygen ($O_2$) and carbon monoxide (CO).

* * * * *